United States Patent

Doran et al.

[11] 3,969,177
[45] July 13, 1976

[54] LAMINATING METHOD

[75] Inventors: Donald E. Doran, New Milford, Pa.; Carl E. Samuelson, Johnson City, N.Y.

[73] Assignee: International Business Machines Corporation, Armonk, N.Y.

[22] Filed: June 24, 1974

[21] Appl. No.: 482,055

[52] U.S. Cl. ............................... 156/288; 156/289; 156/330; 428/273; 428/433
[51] Int. Cl.² ......................................... H05K 3/00
[58] Field of Search ........... 156/228, 247, 288, 289, 156/330, 221, 219; 161/DIG. 7; 428/273, .433

[56] References Cited
UNITED STATES PATENTS

| | | | |
|---|---|---|---|
| 1,597,539 | 8/1926 | Novotny et al. | 156/90 |
| 3,303,081 | 2/1967 | Michaelson et al. | 156/219 |
| 3,573,126 | 3/1971 | Kougel | 156/288 |
| 3,616,011 | 10/1971 | Endrissi | 156/219 |
| 3,661,672 | 5/1972 | McGuade | 156/289 |

Primary Examiner—Douglas J. Drummond
Assistant Examiner—Jerome W. Massie
Attorney, Agent, or Firm—Kenneth P. Johnson

[57] ABSTRACT

Method of laminating pluralities of sheets as unitary panels with heat and pressure curable adhesive in which unlaminated, uncured sheet pluralities are alternately stacked in a press lay-up with partially cured or semicured unitary sheet pluralities and the entire layup is subjected to heat and pressure for a time sufficient to partially cure the originally uncured sheet pluralities and bring the interspersed, partially cured sheet pluralities to full cure. Thereafter, the newly partially cured and fully cured units are removed and the partially cured units used alternately with new uncured sheet pluralities. This method obviates the need for planishing plates heretofore used to produce smooth surfaces on metal foil covered core units for printed circuit manufacture.

8 Claims, 2 Drawing Figures

LAMINATING METHOD

BACKGROUND OF THE INVENTION

When printed circuits are manufactured by the subtractive or etched process, panels are used which generally comprise an epoxy resin-impregnated woven glass fiber layer commonly known as "prepreg," having bonded on opposite sides thin copper foil. This unitary assembly, frequently called a core, is then coated with a photosensitive resist, suitably exposed and developed, and thereafter etched to produce the desired conductive paths on the surface of the glass fiber layer.

With the advent of film-type photoresists, it has been found necessary to provide a relatively smooth surface on the copper covered cores so that the photoresist film is well secured over the entire surface of the copper and does not bridge depressions under which etching solutions may penetrate. Therefore, during the lamination of the copper foil to the epoxy resin-impregnated glass fiber layer, a smoothly finished steel planishing plate has been used next to the copper foil to achieve the necessary smoothness required of the copper surface.

A press lay-up consists of several loose core assemblies of resin-impregnated glass cloth layers and sheets of metal foil, and planishing plates are inserted between each metal-glass cloth-metal grouping of sheets. The planishing plates occupy a large portion of each press opening and thereby severely limit the capacity of the press to produce printed circuit cores each cycle. After the press openings are filled, the press is actuated to apply pressure to the lay-up and the platens are heated to cure the epoxy resin. The planishing plates heat slowly and absorb large quantities of ineffective energy. This compressing and heating cycle requires approximately a 2-hour period, depending primarily upon the adhesive and temperature used. Thereafter, the press is opened, the now-laminated cores are removed, and the planishing plates are reused with new loose assemblies of resin impregnated glass fiber and foil.

The steel planishing plates have been found to produce dimensional instability of the laminated panels because the steel has a thermal coefficient of expansion different from that of the metal foil or glass fiber and resin layers. Thus, during the curing process, the panel is cured with stresses which are retained and cause instability during subsequent processing steps for the cores or panels. In addition, planishing plates are of significant weight and contribute to operator fatigue during the insertion and removal of the plates when laying up and tearing down press loads. Although the planishing plates are usually made of a durable material such as stainless steel, they eventually became dented or scratched with use and at times have to be resurfaced because these imperfections are transferred to the copper foil.

Accordingly, it is a primary object of this invention to provide a laminating method which obviates the need of planishing plates for surface finishes.

Another important object of this invention is to provide a laminating method which provides improved dimensional accuracy in the laminate produced thereby.

A still further object of this invention is to provide a laminating method which results in greater production of laminated panels with fewer defects thus effecting significant cost savings.

Yet another object of this invention is to provide a multi-step laminating method in which partially cured panels are substituted for planishing plates with loosely laid up sheets that make up a core assembly.

SUMMARY OF THE INVENTION

The foregoing objects are attained in accordance with the present invention by forming a plurality of partially cured laminated core units by the conventional method using planishing plates and thereafter substituting these partially cured cores for planishing plates in succeeding press loads. The partially cured cores are alternately laid-up with loose sheet assemblies of future cores and the entire lay-up is then compressed and heated for a portion of the normal cycle required for fully curing the cores. With this procedure, the partially cured cores that were substituted for planishing plates are brought to full cure and the loosely laid up sheet pluralities of future cores then become the partially cured cores and are used as substitutes for planishing plates in a succeeding press load.

With this process, it has been found that planishing plates are unnecessary and that three to fivefold increases in press capacity are achieved, thus reducing the unit cost of producing laminated cores. Since each foil-"prepreg"-foil sandwich is used once as a planishing plate, it produces acceptably smooth surfaces for film type photoresists and decreases the number of imperfections transmitted by continually reused planishing plates. A further significant advantage is the elimination of thermal instability formerly noted; with the novel process, each sheet plurality of foil and "prepreg" layers is adjacent a similar unit having identical thermal coefficients of expansion during the heating and cooling cycles. The greater stability reduces the number of unacceptable panels and improves the accuracy in the registration of the subsequently formed conductors. The elimination of planishing plates also reduces operator fatigue since the cores are much lighter in weight. A further advantage is improved thickness uniformity throughout the cores.

The foregoing and other objects, features and advantages of the invention will be apparent from the following more particular description of a preferred embodiment of the invention as illustrated in the accompanying drawings.

DESCRIPTION OF THE PREFERRED EMBODIMENT

In the following description "prepreg" designates the insulative filler or support sheets used between conductive metal foil layers. The insulative layer may be impregnated or coated with a curable adhesive. Prepreg layers are usually impregnated with a polymeric resin as the adhesive which requires time to crosslink. The crosslinking or curing is accelerated by using heat. The insulative sheet is first saturated or coated with the resin in liquid form and the coated sheet is then partially cured to what is commonly designated "B-stage" in which some crosslinking has occurred. The prepreg sheets which have been advanced to B-stage are cut in the desired panel sizes and can be easily handled individually without danger of adherence to one another or other objects. However, the full strength of the adhesive is not achieved until the polymer is advanced to "C-stage" or is fully crosslinked. In the description below, "uncured" and "partially cured" are used. "Uncured" is intended to mean prepreg at B-stage and "partially cured" is intended to mean a part of the curing time required to advance the cure of prepreg from B-stage to C-stage. Such curing is usually done under conditions of heat and pressure to liquify and reflow the B-stage resin and advance the cure.

Figure 1:
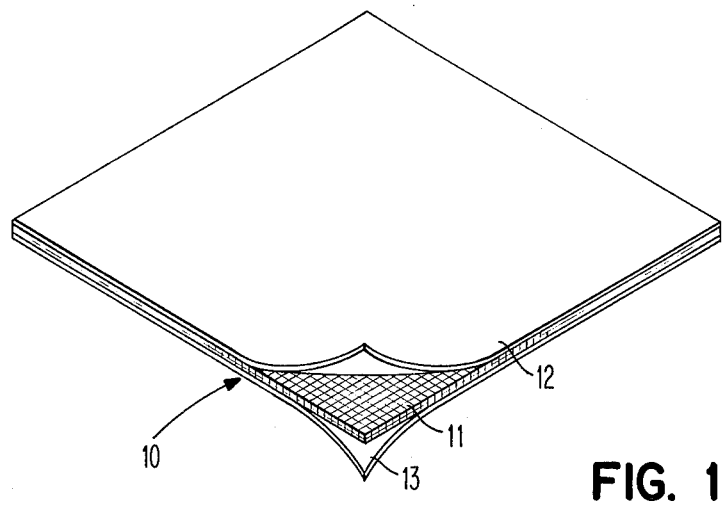
FIG. 1 is an isometric view of a laminate produced in accordance with the method of the invention.

In FIG. 1 there is shown a laminated core 10 comprising at least one inner prepreg layer 11 sandwiched between two outer layers 12 and 13. The center layer 11 may be, for example, paper or woven glass fiber cloth, impregnated with B-stage organic polymeric resin, such as an epoxy resin. Other adhesives such as polyimides or polyesters may also be used. The outer layers 12 and 13 may be copper or aluminum foil or other suitable conductive material if the resulting laminate is to be eventually used for printed circuit manufacture. After the layers have been loosely assembled together they are placed in a press under heat and pressure to advance the curing of the adhesive resin.

Once formed, laminate or core 10, when used for printed circuits, is further processed by applying photosensitive resist coatings to the metal foil layers, then exposing the photosensitive material to selectively crosslink the coating. The portions of the resist coating required for proper circuitization are removed through development processes and the metal thereunder subjected to an etchant to form conductive lines. Proper adherence of film type photoresist requires a smooth surface on the metal foil in which maximum peak to valley roughness is 0.2 mils. If the roughness exceeds this value, then, during the etching process, the etchant may possibly bleed under the bridged surface areas and erode the metal in the conductive regions. Heretofore, smoothly finished planishing plates have been used next to the metal foil of each core during the pressing and heating cycle to ensure the requisite smoothness. The planishing plates are conventionally of stainless steel, smoothly finished so that an acceptable surface is respectively reproduced in the foil layers. However, the planishing plates are heavy and also require refinishing when scratched or gouged.

Figure 2:
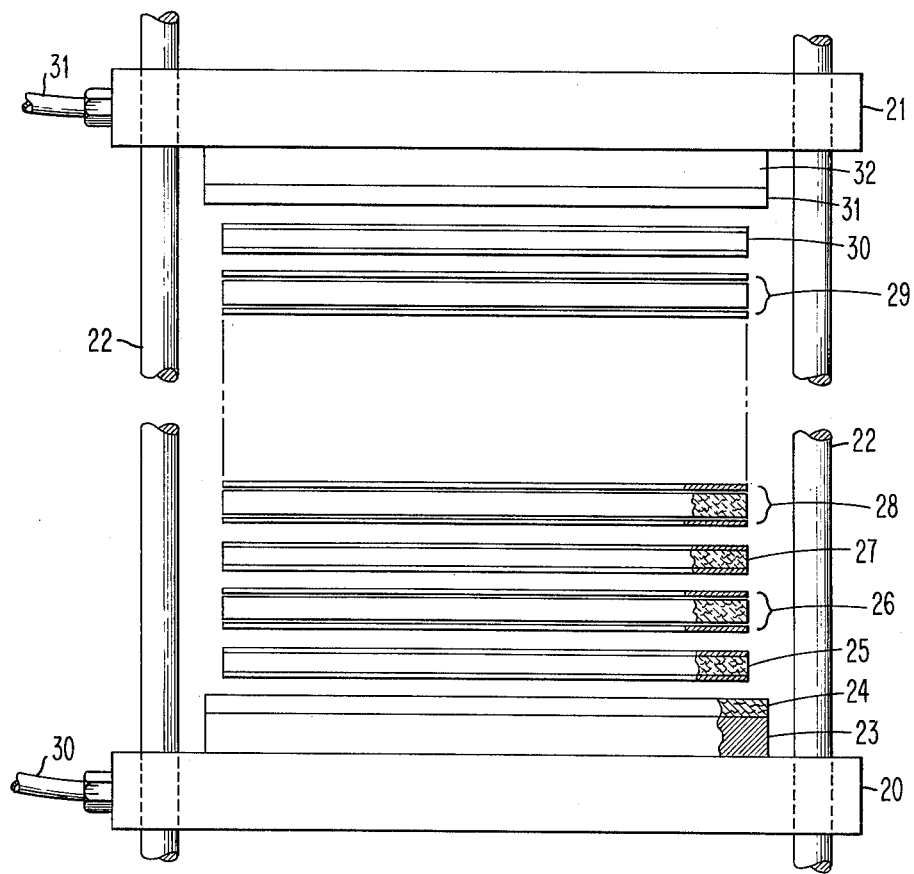
FIG. 2 schematically illustrates a press lay-up for producing laminated panels in accordance with the principles of the invention.

In FIG. 2, there is illustrated a press lay-up in which planishing plates are omitted and only the foil-prepregfoil layers are used both as raw lay-up and as elements to produce acceptably smooth core surfaces. In the figure, platens 20 and 21 of a press are movable along guide rods 22 toward and away from each other to compress and release laminates stacked therein. In providing a lay-up according to the invention, a metal carrier plate 23 is first laid down on which is placed a press pad 24, usually comprising multiple plies of paper. The press pad serves to uniformly distribute pressure and produce a heat lag to the immediately adjacent cores. On the press pad is placed a partially cured core unit 25 made up of foil-prepreg-foil layers which have already been subjected to a partial curing from B-stage and C-stage. The partially cured cores used for the initial cycle can be made with the conventional planishing plates to produce the smooth surfaces.

On partially cured core 25, there is laid a raw or uncured assembly of foil and prepreg layers to form core 26. The uncured assembly is made up of the same layers as partially cured core 25, except that the layers are loosely stacked one over the other. Next is placed another partially cured core 27 on which another stack of loose layers for uncured core 28 is placed. This alternate placement of partially cured and uncured sheet pluralities is continued until the press opening between platens 20 and 21 is filled to capacity ending with uncured core 29 and partially cured core 30. On top of core 30 is placed a second press pad 31 similar to press pad 24 at the bottom of the stack. The lay-up is then topped with a second carrier plate 32. Typically, laminating presses which have the capability of curing with heat have multiple platens and openings between platen pairs for simultaneously processing several press lay-ups. Only a single opening has been shown in FIG. 2.

After the press openings have been filled, the press is actuated to compress the uncured and partially cured cores to the desired pressure. During the compression, platens 20 and 21 are heated. This is usually accomplished by supplying steam through ducts 30 to heat the platens to the desired temperature. The pressures used to compress the cores and temperatures to which the cores are heated will vary according to the adhesive used. Typically, with conventional epoxy resins, curing is accomplished under pressures of 500 to 700 psi, and with temperatures that range from 340° to 380° F. A full cure to C-stage generally requires maintaining the pressure and temperature for a period of two hours. Thus, if curing is to be accomplished in two stages, curing cycle time is cut to one hour for each stage. In that case, the uncured cores will be semicured and each core will receive only the usual total of curing time. The curing requires that the adhesive in all sheet pluralities be brought to the requisite curing temperature and, therefore, some time is required for the centermost sheets to reach the particular temperature. The curing time obviously will vary according to the adhesive composition, quantity, and the curing temperature and pressure. Therefore, curing conditions will vary with each laminate manufacturer's practices. It has been found, however, that the method of the invention does not require extended curing times. Although an increased number of core units are included with each press lay-up when using the invention, the removal of metal planishing plates has also removed an energy drain, so that the heat is used more efficiently.

At the termination of the curing cycle, laminates 25-30 are removed. Laminates 25, 27, and 30, having been initially placed in the press as partially cured cores, now are fully cured to C-stage, and ready for subsequent use or processing. However, the former loose assemblies of layers forming laminates 26, 28, and 29 are now partially cured and these panels can be used as planishing plate substitutes or separators for the new loose sheet assemblies in a succeeding press lay-up. At the conclusion of the following cycle, partially cured cores 26, 28, and 29 will then have become fully cured.

It has been found that semicured cores produce sufficiently smooth surfaces on uncured assemblies to eliminate the need for permanent planishing plates. The repeated use of fully cured core units as substitute planishing plates slowly but progressively degrades the smoothness of succeeding core units. The preferred practice for the semicured core units is a single use as a separator to maintain the desired surface smoothness of 0.1 to 0.2 mils. By using semicured cores as separators, there is excellent matching of thermal characteristics for both the semicured and uncured sheet pluralities during heating and cooling so that stresses are practically non-existent within each finished laminate.

The above method has been described in which each core is semicured during each press cycle. In instances when surface finish is not of such importance as when used with liquid photoresists, cores need not be half-cured but may be cured in press cycles which are a third or less of the full cure cycle. The partially cured cores can then be used two or more times.

While the invention has been particularly shown and described with reference to a preferred embodiment thereof, it will be understood by those skilled in the art that various changes in form and details may be made therein without departing from the spirit and scope of the invention.

We claim:

1. The method of laminating sheet pluralities into laminated panels comprising the steps of:

alternating stacking in a press layup pluralities of sheets of material having uncured heat curable adhesive thereon and other pluralities of said sheets of material and adhesive that have been partially cured to a laminate form, said sheet pluralities having therebetween at least one non-cohesive surface;

subjecting said stack of uncured and partially cured sheet pluralities to heat and pressure for a predetermined time to partially cure as newly formed laminates said uncured sheet pluralities and advance the cure of said partially cured laminates; and using said partially cured, newly formed laminates as alternate separators between other uncured sheet pluralities in a succeeding press layup.

2. The method as described in claim 1 wherein each sheet plurality includes a pair of metal foil layers sandwiched around a layer of woven glass fibers impregnated with uncured polymeric resin.

3. A method as described in claim 2 wherein said resin is an epoxy resin.

4. A method as described in claim 1 wherein said metal foil layers are copper or aluminum.

5. A method of laminating sheet pluralities comprising the steps of:

forming partially cured laminates of pluralities of loose sheet material having an adhesive thereon curable to full effectiveness by subjection to heat for a predetermined time, each laminate of said loose sheet pluralities having non-cohesive outer surfaces;

alternately interposing loose sheet pluralities to be laminated and said partially cured laminates in a press layup, each said loose sheet plurality having uncured heat curable adhesive therefor and having non-cohesive outer surfaces;

subjecting said layup of alternate partially cured and uncured loose sheet pluralities to heat and pressure for a portion of said predetermined time sufficient to fully cure said partially cured laminates and partially cure to laminate form said loose sheet pluralities; and removing said stack of new fully cured and partially cured laminates from said layup and reusing said new partially cured laminates alternately with other uncured loose sheet pluralities in a succeeding press layup.

6. The method as described in claim 5 wherein each said loose sheet plurality includes at least one layer of insulative material impregnated with a polymeric resin advanced to B-stage cure and the resin of said partially cured sheet pluralities is between B-stage and C-stage.

7. A method of laminating sheet pluralities comprising the steps of:

providing pluralities of loose sheets as core units in which each core unit has at least a pair of sheets with uncured adhesive therefor which is curable to full effectiveness when subjected to heat for a predetermined time and in which each core unit has thereon at least one non-cohesive surface;

partially curing a first plurality of said uncured core units in a laminating press, removing said partially cured first core units from said press;

alternately stacking in said laminating press a second plurality of said uncured core units with said partially cured first core units;

activating said press for a portion of said predetermined time to bring said partially cured first core units to a state of full cure and said uncured second core units to a partially cured state; and removing said pluralities of first and second core units from said press and repeating the process of activating said press with alternately stacked partially cured and uncured core units by adding a third plurality of said uncured core units with said second plurality of partially cured units.

8. The method as described in claim 7 wherein said steps of partially curing said uncured core units are of sufficient duration to produce semicured core units.

* * * * *